(12) United States Patent
Zhang et al.

(10) Patent No.: US 8,654,534 B2
(45) Date of Patent: Feb. 18, 2014

(54) ELECTRONIC DEVICE WITH PREDETERMINED ASSEMBLY/DISASSEMBLY ORDER

(75) Inventors: Guang-Yi Zhang, Shenzhen (CN); Tie-Shan Jiang, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

(*) Notice: Subject to any disclaimer, the term of this patent is extended or adjusted under 35 U.S.C. 154(b) by 290 days.

(21) Appl. No.: 13/241,265

(22) Filed: Sep. 23, 2011

(65) Prior Publication Data
US 2012/0320534 A1 Dec. 20, 2012

(30) Foreign Application Priority Data
Jun. 15, 2011 (CN) .......................... 2011 1 0160351

(51) Int. Cl.
*H05K 7/16* (2006.01)
(52) U.S. Cl.
USPC ........... 361/726; 361/730; 361/732; 361/740; 361/741; 312/221.1; 312/223.3; 312/333; 312/321.1; 312/319

(58) Field of Classification Search
USPC ................. 361/725–728, 730, 732, 740, 741; 312/221.1–223.3, 333, 332.1, 319
See application file for complete search history.

(56) References Cited

U.S. PATENT DOCUMENTS 7,643,306 B2 * 1/2010 Karstens ....................... 361/754

* cited by examiner

*Primary Examiner* — Robert J Hoffberg
*Assistant Examiner* — Hung Dang
(74) *Attorney, Agent, or Firm* — Altis Law Group, Inc.

(57) ABSTRACT

An electronic device includes a cabinet and electronic units received in the cabinet. A window is defined between two front columns. Each electronic unit includes a casing, which includes a top plate, a lateral side and a rotator. The lateral side defines an engaging opening therein. The rotator is movably connected to the casing and includes an engaging portion and an abutting portion. The abutting portion extends above the top plate. the engaging portion is received in the casing. When the abutting portion is pushed down, the rotator moves to cause the engaging portion to extend through the engaging opening to engage with the cabinet and to prevent the casing from being pulled out from the cabinet.

17 Claims, 9 Drawing Sheets

ELECTRONIC DEVICE WITH PREDETERMINED ASSEMBLY/DISASSEMBLY ORDER

BACKGROUND

1. Technical Field

The present disclosure relates to an electronic device and particularly to an electronic device with a predetermined sequence for assembly.

2. Description of Related Art

Electronic devices such as server assemblies include a cabinet, and a plurality of servers received in the cabinet and arranged in a stack. When the servers need to be repaired or replaced, the servers can be pulled outside of the cabinet. However, in some electronic devices, the servers must be pulled outside of the cabinet in a predetermined sequence. If users does not know that and pull the servers outside in a wrong sequence, the electronic devices may be out of work.

What is needed, therefore, is an electronic device which cannot be removed if a pull-out sequence is wrong.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
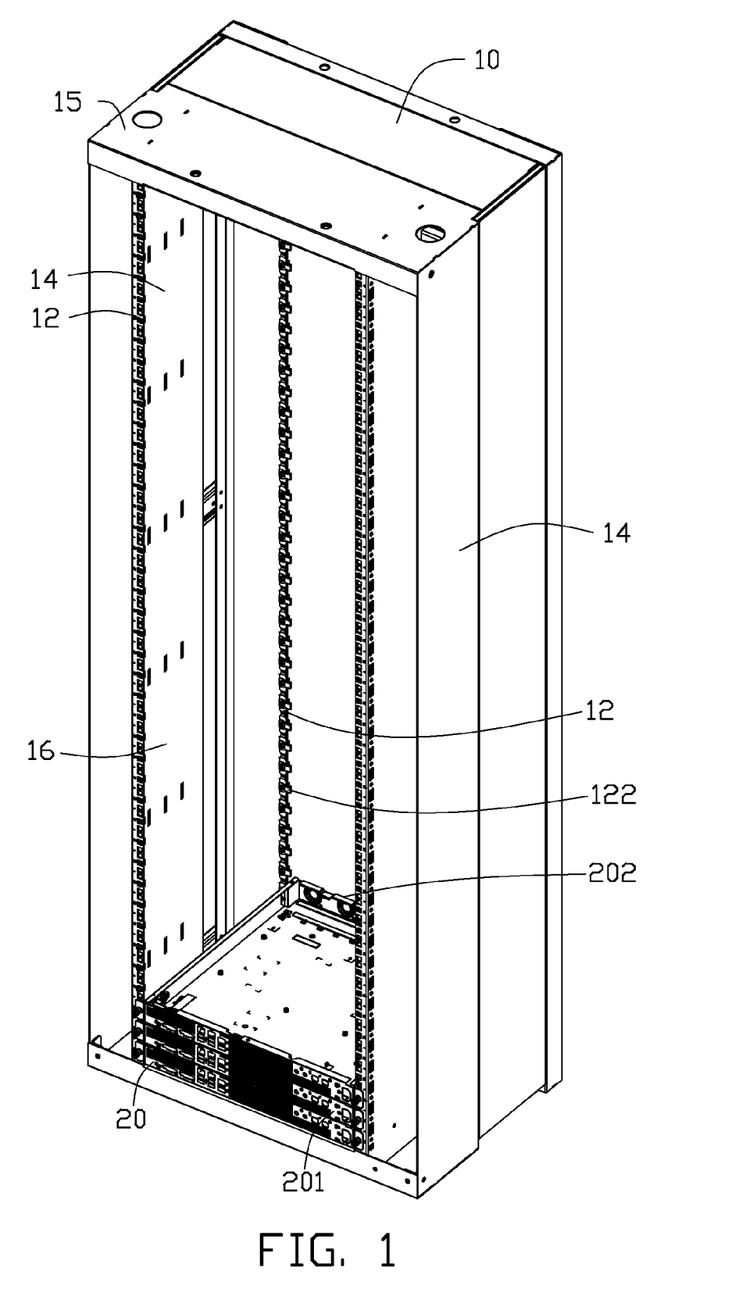
FIG. 1 is an isometric view of an electronic device with a plurality of electronic units stacked together, in accordance with an embodiment of the present disclosure.
Figure 6:
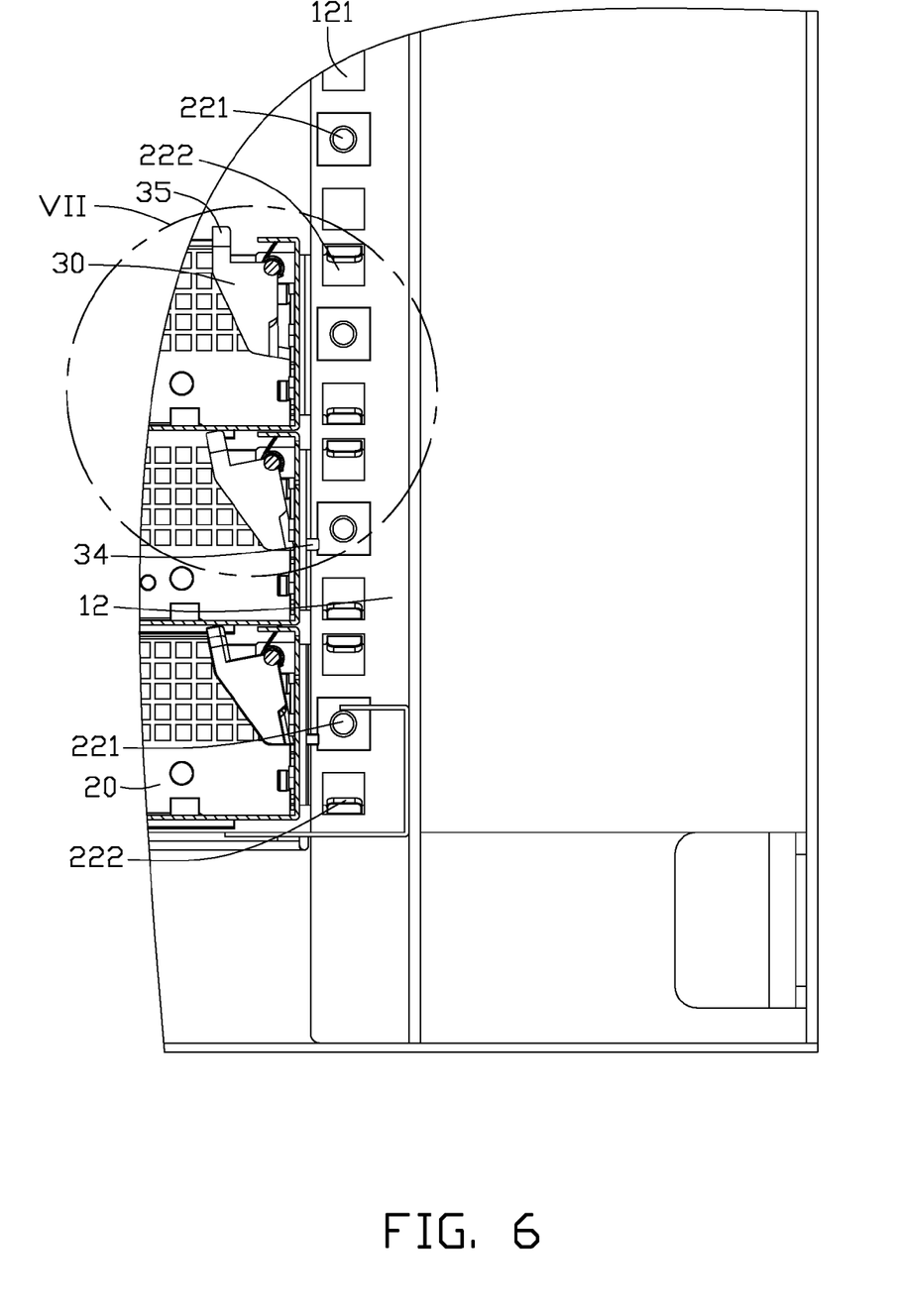
FIG. 6 is a partial, cross-sectional view of the electronic device in FIG. 1.
Figure 7:
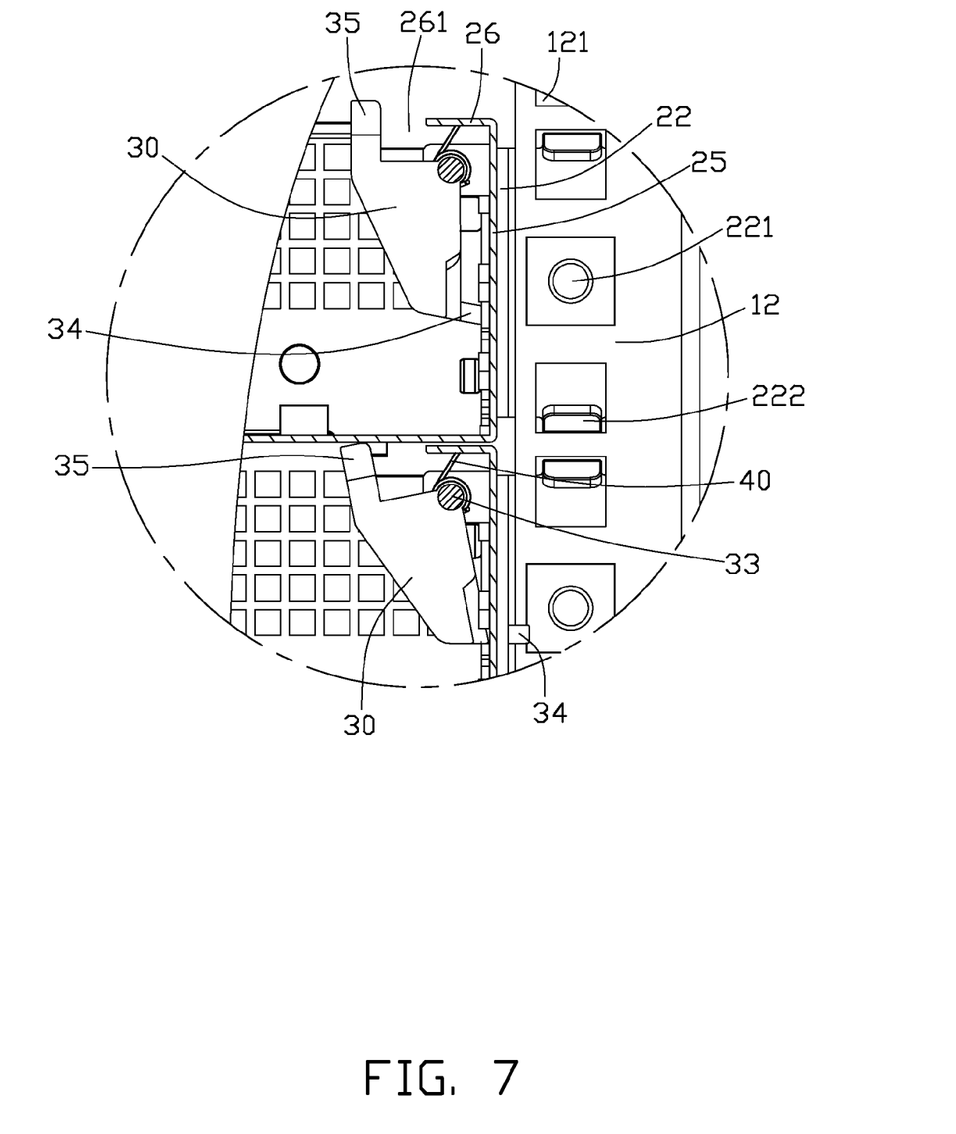
FIG. 7 is an enlarged view of a circled part VII of FIG. 6.

Referring to FIGS. 1, 6 and 7, an electronic device in accordance with an embodiment of the present disclosure is shown, here the electronic device is a server assembly. In particular, the server assembly is a non-rail type server assembly. It is noted that the electronic device can also other types of devices. For example, the electronic device may also be a storage device assembly.

The electronic unit comprises a cabinet 10, and a plurality of casings 20 for receiving servers (not shown) received and stacked in the cabinet 10. The casings 20 are arranged one above another. The front and rear ends of the casings 20 are secured to the cabinet 10. A rotator 30 is accommodated in each of the casings 20. When one of the casings 20 is located above another, the rotator 30 of the lower casing 20 will be automatically pressed down and secured to the cabinet 10, therefore preventing the lower casing 20 from being pulled out of the cabinet 10 before the one above it is. For the bottommost casing 20, the rotator 30 may be engaged with the cabinet 10 to prevent any other casings 20 from being installed below. As such, the rotator 30 is employed to require a given sequence for the assembly and disassembly of the casings 20, thus avoiding operations with false assembly/disassembly sequences.

The electronic unit will be described in more detail with reference to other drawings. Referring to FIG. 1, the cabinet 10 comprises a column 12 positioned at each of the four corners thereof. A plurality of front, back and lateral side plates 14 and a top plate 15 are coupled to the columns 12 to form a substantially enclosed housing for receiving the casings 20. A window 16 is defined between two front columns 12, through which the casings 20 can be inserted into and withdrawn from the cabinet 10.

In FIG. 1, three casings 20 are assembled in the cabinet 10. The number of the casings 20 assembled in the cabinet 10 varies according to requirement. For example, there can be only one casing 20 assembled in the cabinet 10, or multiple casings 20 fully filling the cabinet 10. The front end 201 of each casing 20 is secured to the two front columns 12. The rear end 202 of each casing 20 is secured to the two rear columns 12.

Figure 2:
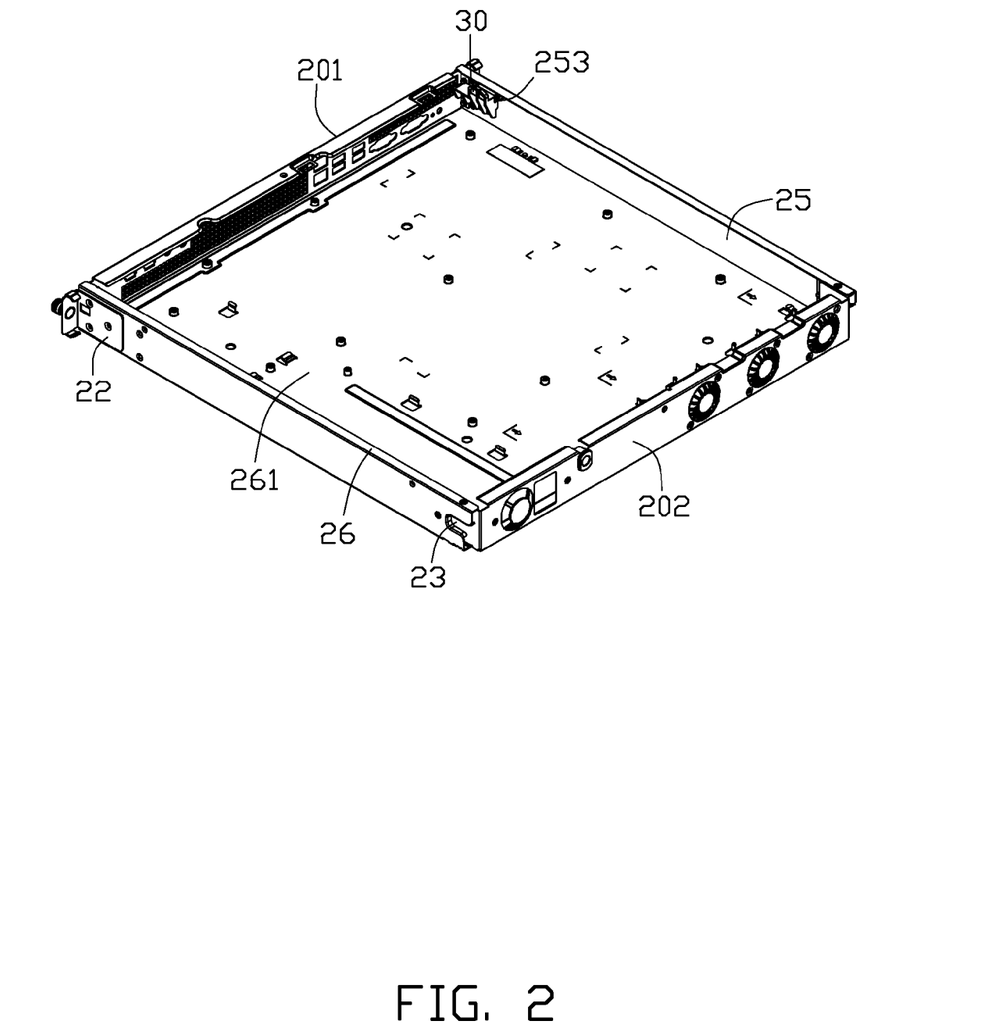
FIG. 2 is an enlarged view of a casing of one of electronic units of the electronic device of FIG. 1.
Figure 3:
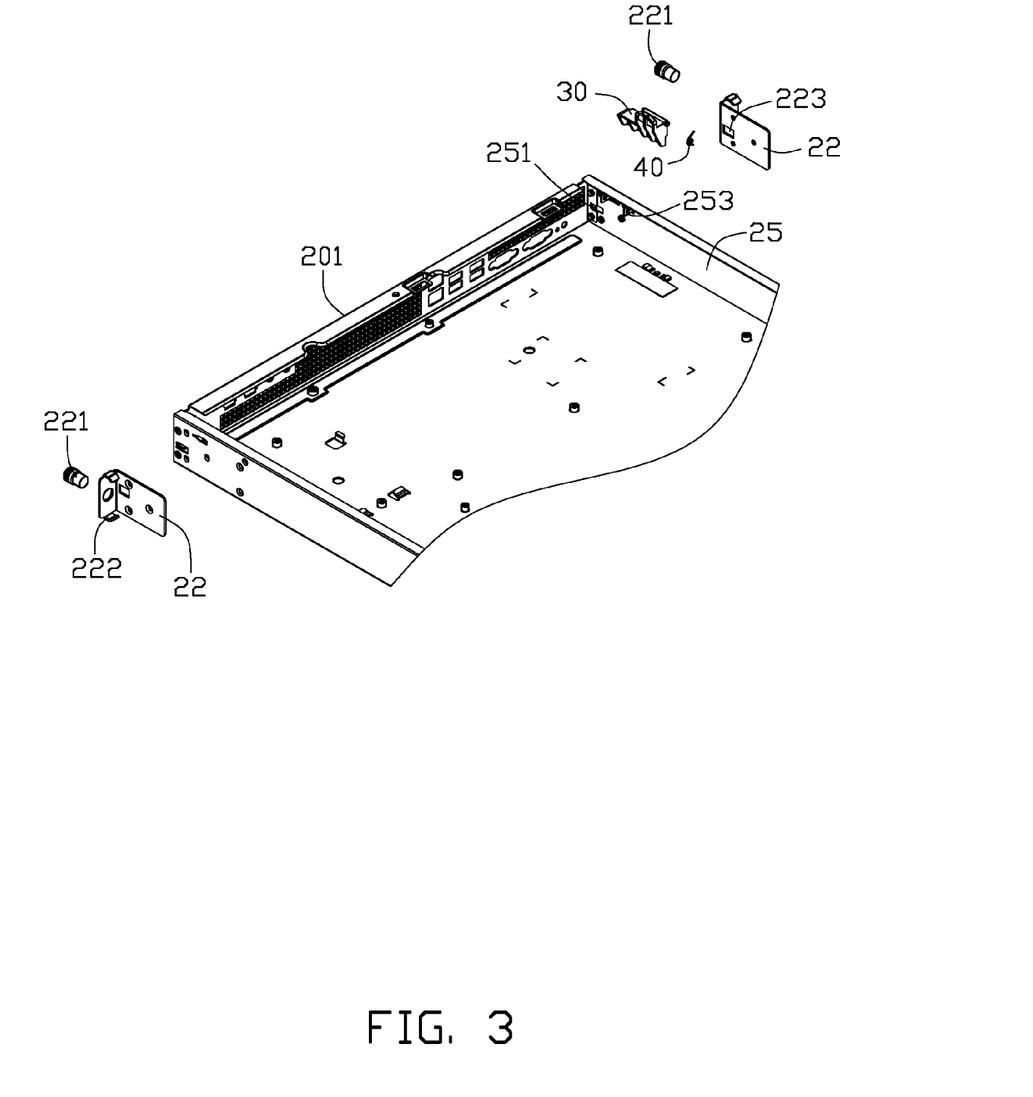
FIG. 3 is a partial, exploded view of the casing of FIG. 2.

Also referring to FIGS. 2, 3 and 7, each casing 20 has a substantially rectangular box shape to receive electronic items such as servers. The top cover of the casing 20 is omitted for clarity. Two L-shaped securing plates 22 are formed on the front end 201 of the casing 20. The securing plates 22 are fixed adjacent to two ends of the front end 201, and detachably connect the front end 201 of the casing 20 to the front columns 12. Two securing mortises 23 are defined in two sides of the casing 20 and adjacent to the two ends of the rear end 202 of the casing 20. A plurality of tenons 122 is formed on the two rear columns 12. Each securing mortise 23 engagingly receives a tenon 122, whereby the rear end 202 of the casing 20 is secured to the two rear columns 12. Specifically, the two securing plates 22 are positioned at the two sides of the front end 201 of the casing 20. Each securing plate 22 comprises two claws 222, extending rearward. A plurality of securing holes 121 is defined in the two front columns 12. The claws 222 are inserted into two corresponding securing holes 121 of the respective front column 12, and a screw 221 locks the securing plate 22 on the front column 12. In alternative embodiments, the casing 20 can be secured to the columns 12 by any other mechanism known in the art.

An engaging opening 251 is defined in a side of the casing 20, for example, the left lateral side 25 of the casing 20. The engaging opening 251 is configured near the front end 201. The engaging opening 251 is configured for allowing a part of a rotator 30 to extend therethrough and be engaged in a vertical groove (not labeled) of the corresponding front column 12 of the cabinet 10 (which will be described in more details hereinafter). Since one of the securing plates 22 is positioned at the location where the engaging opening 251 is defined, a clearance through hole 223 is further defined in the securing plate 22 for the part of the rotator 30 to extend therethrough. Two securing tabs 253 are formed on an inner surface of the left lateral side 25 of the casing 20, a pivoting hole (not labeled) is defined in each of the securing tabs 253, for the rotator 30 to rotate on.

An inserting opening 261 is defined in a top plate 26 of the casing 20 for installing the rotator 30 to extend therethrough (which will be described in more details hereinafter). In a casing 20 without the top plate 26, the opening above the casing 20 exists anyway.

Figure 4:
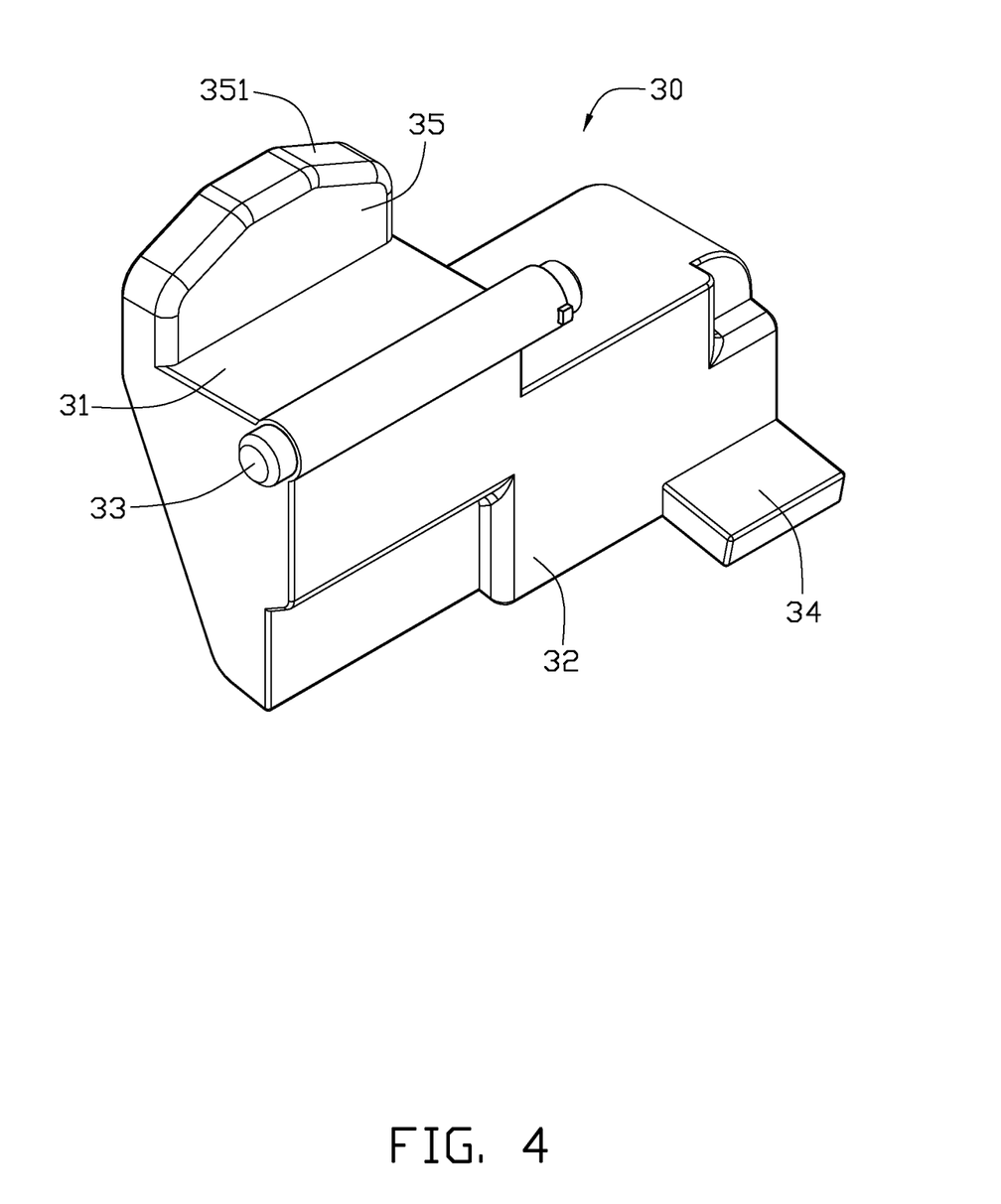
FIGS. 4 and 5 are enlarged views of a rotator of the casing of FIG. 2, shown from different aspects.
Figure 5:
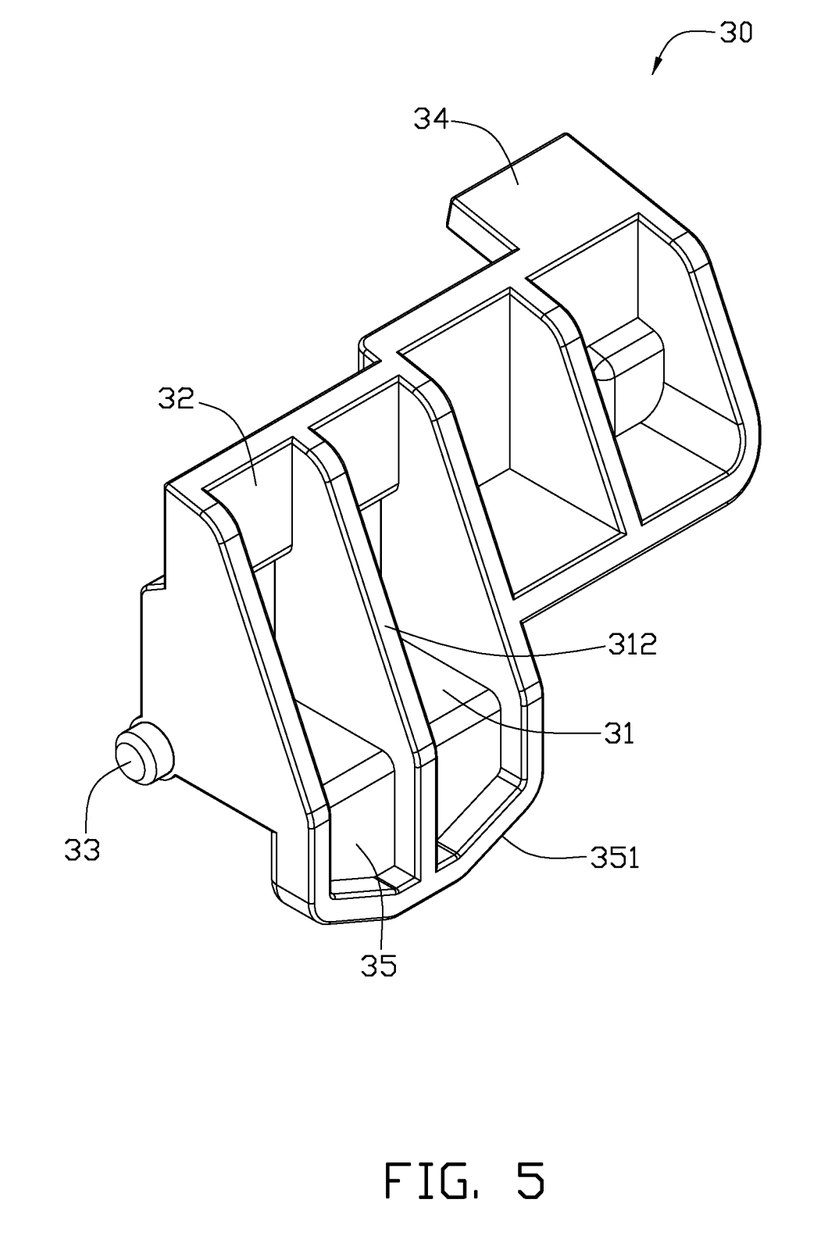

Referring to FIGS. 4 and 5, each rotator 30 includes a pivot pin 33, a horizontal plate 31 extending horizontally from the pivot pins 33, and a vertical plate 32 extending vertically from the pivot pins 33. An elastic element 40 such as a spring is sleeved on the pivot pin 33. The pivot pin 33 is pivoted on the securing tabs 253 via the pivoting holes. As such, the rotator 30 is able to be pivotally connected to the securing tabs 253 of the top plate 26 of another casing 20. An abutting portion 35 extends upwardly from the horizontal plate 31. An engaging portion 34 extends horizontally and outwardly from the vertical plate 32. Specifically, the engaging portion 34 extends from an end of the vertical plate 32. The engaging portion 34 is capable of extending through the engaging opening 251 of the left lateral side 25 of the casing 20. A plurality of ribs 312 is formed between the horizontal plate 31 and the vertical plate 32, for enhancing the structural strength of the rotator 30.

The rotator 30 is rotatable about the securing tabs 253. The abutting portion 35 extends through the inserting opening 261 of the top plate 26 of the corresponding casing 20 and is exposed to the outside of the casing 20. In a certain state, the engaging portion 34 is not exposed to the outside of the casing 20. When a force is applied downwards to the abutting portion 35 of the rotator 30, the rotator 30 can rotate around the pivot pins 33. The engaging portion 34 of the rotator 30 will extend through the engaging opening 251 of the left lateral side 25 of the casing 20, and be exposed to the outside of the casing 20 and engage with the columns 12, therefore preventing the removal of the casing 20 from the cabinet 10.

As shown in FIG. 7, due to the pressure from the upper casing 20, the abutting portion 35 of the rotator 30 of the lower casing 20 is urged to move inwards, and the rotator 30 is forced to rotate around the pivot pin 33. Accordingly, the engaging portion 34 of the rotator 30 is moved out of the lower casing 20. The engaging portion 34 of the rotator 30 extends through the engaging opening 251 of the left lateral side 25 of the casing 20 and the through hole 223 of the securing plate 22, and engages with the front column 12 positioned outside the casing 20. Therefore, the lower casing 20 cannot be pulled out of the window 16 while the rotator 30 is being pressed by the upper casing 20.

When the casing 20 has no other casing 20 above it, the abutting portion 35 of the rotator 30 in the casing 20 extends through the inserting hole 261 of the top plate 26, and the engaging portion 34 of the rotator 30 does not extend through the engaging hole 251 of the left lateral side 25 of the casing 20 to engage with the corresponding front column 12 positioned outside the casing 20, due to the resilience of the elastic element 40. Therefore after releasing the screws 221, the casing 20 can easily be pulled out from the cabinet 10.

As described above, the existence of the rotator 30 sets a sequence for the disassembly of the casings 20. That is, the casings 20 must be pulled out from the cabinet 10 from top to bottom.

In addition, a casing 20 can not be installed into the cabinet 10 underneath other casings 20, because the abutting portion 35 of the rotator 30 will be blocked by the casings 20 above. Therefore, the rotator 30 also limits the order for installing the casings 20 into the cabinet 10, from the bottom to the top.

When multiple casings 20 are stacked together inside the cabinet 10, the rotator 30 of the top casing 20 makes other casings 20 which are underneath engage with the column 12. Therefore, only the topmost casing 20 requires the utilization of the screws 221 and the securing plate 22.

For facilitating the assembly of another casing 20 above a casing 20, a slanted guiding surface 351 is formed on the abutting portion 35, with the guiding surface 351 facing the window 16 of the cabinet 10. The profile of the guiding surface 351 can be any shape suitable for its purpose.

In some other embodiments, the casing 20 can hold rail-servers. The casing 20 is secured in the cabinet 10 by rails. The casing 20 may also hold other devices such as storage devices or the like.

In an alternative embodiment, the two rotators 30 can be used for each casing 20. The rotators 30 are assembled on both the left and right sides of the casing 20, and the engagement of the rotators 30 with the front columns 12 can be accomplished.

In an alternative embodiment, the rotator 30 can instead be assembled adjacent to the rear end 202 of the casing 20, so that the rotator 30 engages in a vertical groove (not shown) defined in one of the rear columns 12 of the cabinet 10.

Figure 8:
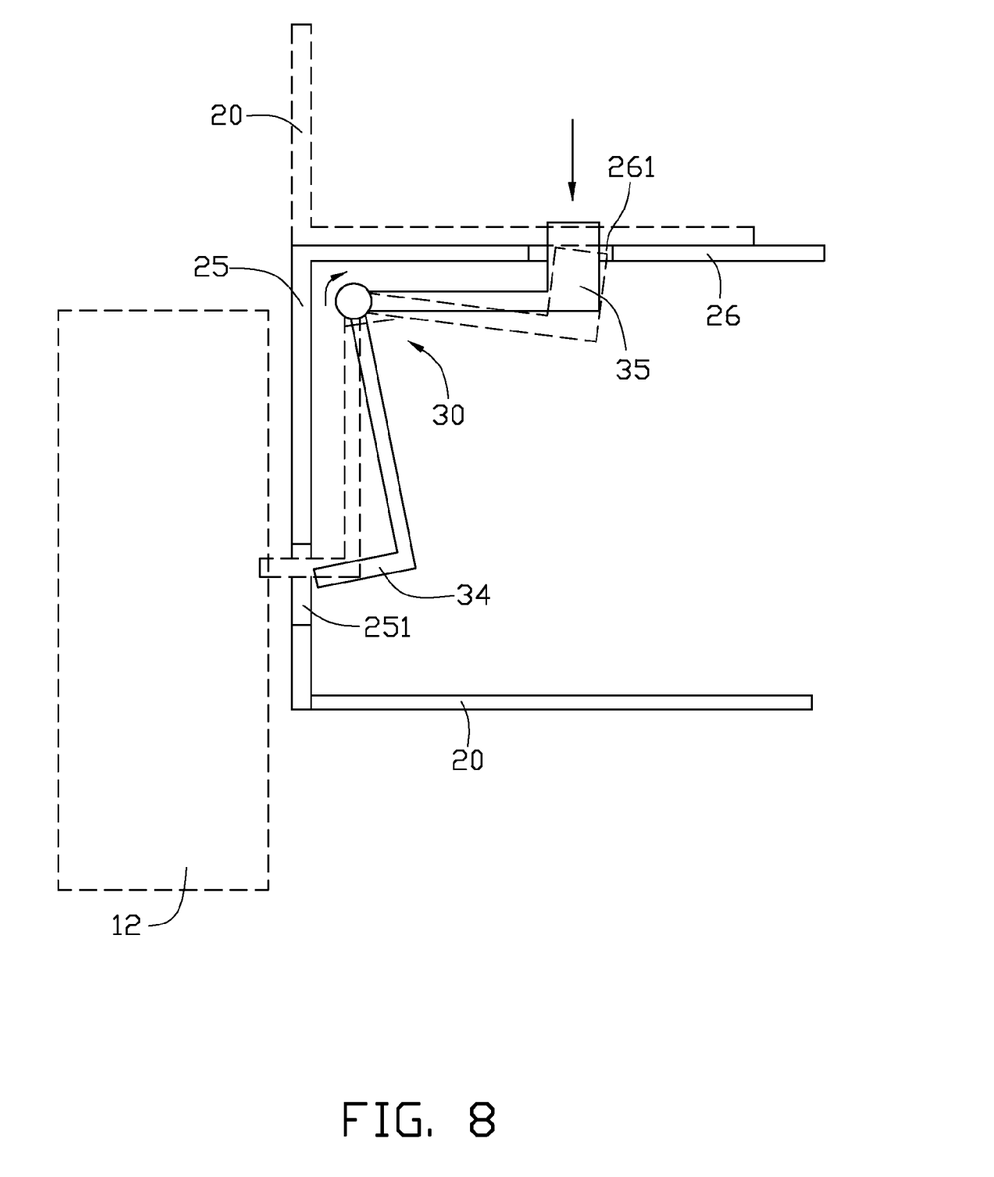
FIG. 8 is a schematic view showing working principles of the rotator of the electronic device.
Figure 9:
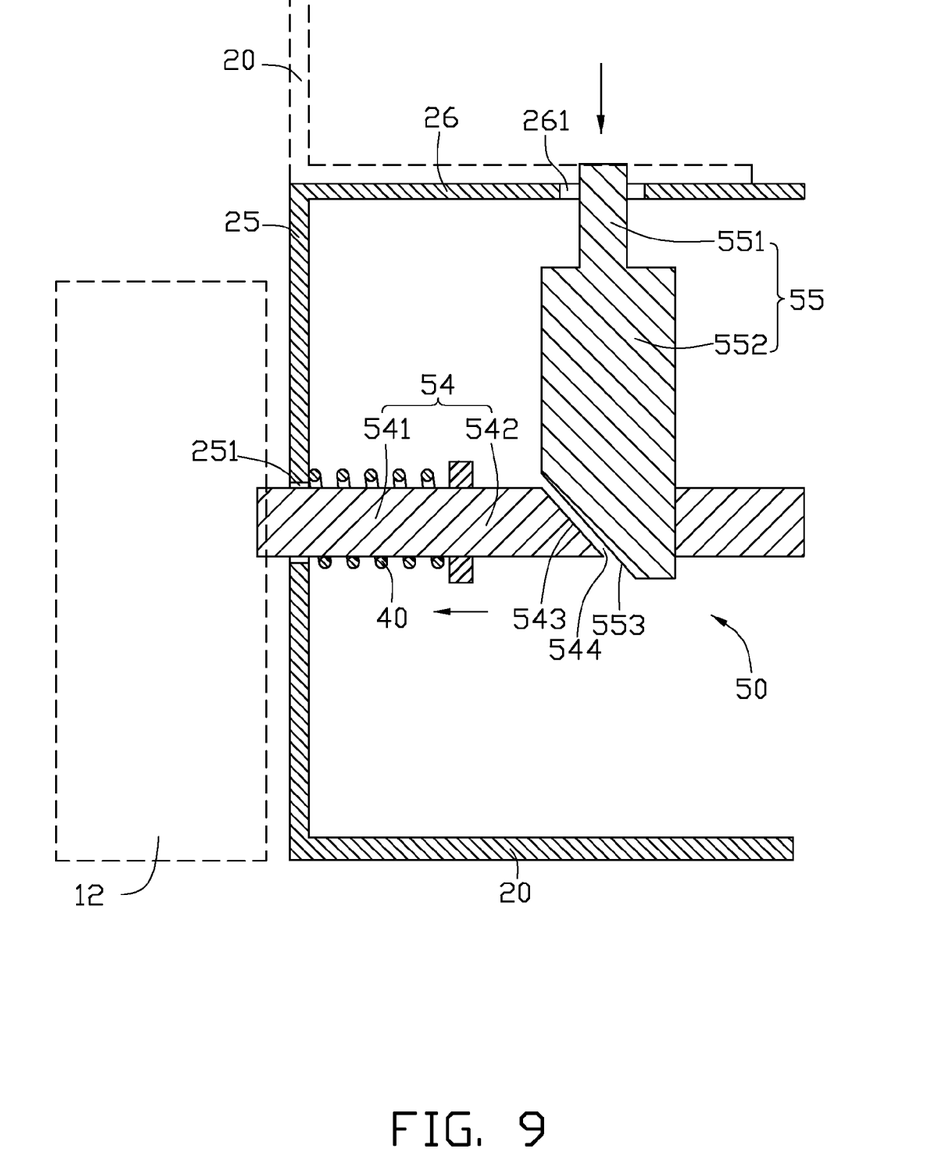
FIG. 9 is a schematic view showing the structure and working principles of a rotator of the electronic device, according to another embodiment.

In addition, the configuration of the rotator 30 is not limited to the embodiments described above. Referring to FIG. 8, the rotator 30 is elastically biased by an elastic element (not shown) to rotate about the top plate 26 of a casing 20. An engaging opening 251 is defined in a lateral side 25 of the casing 20, for an engaging portion 34 of the rotator 30 to extend therethrough. An inserting opening 261 is defined in a top plate 26 of the casing 20, for an abutting portion 35 of the rotator 30 to extend therethrough. The elastic element can urge the abutting portion 35 to extend through the inserting opening 261, and the engaging portion 34 to disengage from a column 12 positioned outside the casing 20. When another casing 20 is directly above the casing 20, a downward force (as shown by an arrow) is applied to the abutting portion 35 of the rotator 30, the abutting portion 35 moves toward the inside of the casing 20 and no longer protrudes from the inserting opening 261, the rotator 30 rotates relative to the top plate 26 of the casing 20, and the engaging portion 34 moves toward the outside of the casing 20 and engages with the column 12, as shown by the dashed lines. FIG. 9 shows a rotator 50 of an electronic device in accordance with another embodiment. The rotator 50 comprises an engaging portion 54 and an abutting portion 55. A first end 541 of the engaging portion 54 is elastically connected to a casing 20 via an elastic element 40, wherein the elastic element 40 abuts a lateral side 25 of the casing 20. The first end 541 of the engaging portion 54 extends through an engaging opening 251 defined in the lateral side 25 of the casing 20, and engages with a corresponding column 12 positioned outside the casing 20.

The abutting portion 55 is isolated from the engaging portion 54. A top end 551 of the abutting portion 55 extends through an inserting opening 261 defined in a top plate 26 of the casing 20. The diameter of a main body 552 of the abutting portion 55 is larger than that of the inserting opening 261, so that the main body 552 cannot escape out from the casing 20 via the inserting opening 261. An abutting surface 553 is formed on the main body 552 of the abutting portion 55. The abutting portion 55 is thus substantially positioned on the top plate 26, with only the topmost part of the top end 551 protruding out of and above the top plate 26. A gap 544 is defined between a second end 542 of the engaging portion 54 and the abutting surface 553. An inner edge of the engaging portion 54 at the gap 544 is defined as a transitioning surface 543. When an downward force (as shown by an arrow) is applied to the top end 551 of the abutting portion 55, the abutting surface 553 pushes the transitioning surface 543 of the engaging portion 54 outward against spring pressure, and the first end 541 of the engaging portion 54 moves outward the casing 20 along the direction shown by a horizontal arrow and engages with the column 12 positioned outside the casing 20.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An electronic device comprising:
   a cabinet defining a front window therein; and
   an electronic unit accommodated in the cabinet, the electronic unit comprising a casing, the casing comprising:
   a front end and a rear end of capable of being engaged to the cabinet,
   a top plate;
   a lateral side defining an engaging opening therein; and
   a rotator movably connected to the casing and comprising an engaging portion and an abutting portion, the abutting portion extending above the top plate, and the engaging portion being received in the casing, wherein when the abutting portion is pushed down, the rotator moves to cause the engaging portion to extend through the engaging opening to engage with the cabinet and to prevent the casing from being pulled out from the cabinet;
   wherein an abutting surface is formed on a main body of the abutting portion, and a transitioning surface is formed on the engaging portion corresponding to the abutting surface, and when the abutting portion is pushed down, the abutting surface pushes the transitioning surface to cause the engaging portion to extend through the engaging opening to engage with the cabinet; and
   wherein a first end of the engaging portion is elastically connected to the casing via an elastic element, and a second end of the engaging portion opposite to the first end is to extend through the engaging opening and engages with the cabinet.

2. The electronic device of claim 1, wherein the top plate defines an inserting opening, a top end of the abutting portion extends through the inserting opening, and a size of the main body of the abutting portion is larger than that of the inserting opening.

3. The electronic device of claim 1, wherein the rotator further comprises a pivot pin, a horizontal plate extending horizontally from the pivot pin and a vertical plate extending vertically from the pivot pin, an elastic element sleeved on the pivot pin and biasing the rotator to keep the abutting portion extending above the top plate, the pivot pin being pivotally connected with the casing.

4. The electronic device of claim 3, wherein the rotator further comprises a plurality of ribs formed between the horizontal plate and the vertical plate.

5. The electronic device of claim 3, wherein two securing tabs are formed on an inner surface of the lateral sides of the casing, and the pivot pin of the rotator is pivotably secured to the securing tabs.

6. The electronic device of claim 1, wherein a guiding surface is provided on a top end of the abutting portion, the guiding surface generally facing towards the window.

7. The electronic device of claim 1, wherein two securing plates are formed on the front end of the casing, the two securing plates being detachably engaged with the cabinet.

8. The electronic device of claim 1, wherein two securing mortises are defined in the rear end of the casing, and a plurality of tenons is formed in the cabinet for engaging in the two securing mortises.

9. An electronic device comprising:
   a cabinet defining a front window therein; and
   at least one electronic unit accommodated in the cabinet, the at least one electronic unit each comprising a casing, front and rear ends of the casing capable of being engaged to the cabinet, the casing insertable into and withdrawable from the cabinet via the window, the casing comprising:
   a top plate defined an inserting opening therein;
   a lateral side defining an engaging opening therein; and
   a rotator movably connected to the casing and comprising an engaging portion and an abutting portion, the abutting portion extending through the inserting opening, the engaging portion being received in the casing, the abutting portion being pushable down to cause the engaging portion to extend through the engaging opening to engage with the cabinet and to prevent the casing from being pulled out from the cabinet.

10. The electronic device of claim 9, wherein an abutting surface is formed on a main body of the abutting portion, and a transitioning surface is formed on the engaging portion corresponding to the abutting surface, and when the abutting portion is pushed down, the abutting surface pushes the transitioning surface to cause the engaging portion to extend through the engaging opening to engage with the cabinet.

11. The electronic device of claim 10, wherein a first end of the engaging portion is elastically connected to the casing via an elastic element, a second end of the engaging portion opposite to the first end is to extend through the engaging opening and engages with the cabinet.

12. The electronic device of claim 10, wherein a top end of the abutting portion extends through the inserting opening, and a size of the main body of the abutting portion is larger than that of the inserting opening.

13. The electronic device of claim 9, wherein the rotator further comprises a pivot pin, a horizontal plate extending horizontally from the pivot pin and a vertical plate extending vertically from the pivot pin, an elastic element sleeved on the pivot pin and biasing the rotator to keep the abutting portion extending above the top plate, the pivot pin being pivotally connected with the casing.

14. An electronic device comprising:
   a cabinet comprising four columns substantially positioned at four corners of the cabinet, a window being defined between two front columns; and
   a plurality of casings accommodated in the cabinet and stacked together, front and rear ends of the casings being engaged to the cabinet, each casing comprising:
   a top plate defined an inserting opening therein;
   a lateral side defined an engaging opening therein; and
   a rotator movably connected to the casing and comprising an engaging portion and an abutting portion;
   wherein the abutting portion of the rotator of the uppermost one of the casings extends through the inserting opening and is exposed outside of the upper casing, and the engaging portion of the rotator of the upper casing being received in the casing; and
   wherein, for any adjacent two of the casings, the abutting portion of the rotator of the lower one of the two casings is pushed down by the upper casing to cause the engaging portion to extend through the engaging opening to engage with the cabinet and to prevent the casing from being pulled out from the cabinet.

15. The electronic device of claim 14, wherein the abutting portion is isolated from the engaging portion, an abutting surface is formed on a main body of the abutting portion, and a transitioning surface is formed on the engaging portion corresponding to the abutting surface, and when the abutting portion is pushed down, the abutting surface pushes the transitioning surface to cause the engaging portion to extend through the engaging opening to engage with the cabinet.

16. The electronic device of claim 14, wherein the rotator further comprises a pivot pin, a horizontal plate extending horizontally from the pivot pin and a vertical plate extending downwardly from the pivot pin, an elastic element sleeved on the pivot pin and biasing the rotator to keep the abutting portion extending through the inserting opening, the pivot pin being pivotally connected with the casing.

17. The electronic device of claim 14, wherein a guiding surface is provided on a top end of the abutting portion, the guiding surface generally facing the window to facilitate assembly of the casings.

* * * * *